United States Patent
Ericsson

(10) Patent No.: US 9,334,561 B2
(45) Date of Patent: May 10, 2016

(54) COATED CUTTING TOOL

(71) Applicant: SANDVIK INTELLECTUAL PROPERTY AB, Sandviken (SE)

(72) Inventor: Bjorn Ericsson, Bromma (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 0 days.

(21) Appl. No.: 14/380,962

(22) PCT Filed: Feb. 26, 2013

(86) PCT No.: PCT/EP2013/053807
§ 371 (c)(1),
(2) Date: Aug. 26, 2014

(87) PCT Pub. No.: WO2013/127786
PCT Pub. Date: Sep. 6, 2013

(65) Prior Publication Data
US 2015/0024183 A1    Jan. 22, 2015

(30) Foreign Application Priority Data
Feb. 29, 2012  (EP) .................................... 12157471

(51) Int. Cl.
| | |
|---|---|
| *C23C 14/06* | (2006.01) |
| *C23C 14/32* | (2006.01) |
| *C23C 14/22* | (2006.01) |

(Continued)

(52) U.S. Cl.
CPC ........... *C23C 14/325* (2013.01); *C23C 14/0641* (2013.01); *C23C 14/22* (2013.01); *C23C 14/3464* (2013.01); *C23C 28/042* (2013.01); *C23C 28/044* (2013.01); *C23C 28/42* (2013.01); *C23C 30/00* (2013.01); *C23C 30/005* (2013.01); *H01J 37/34* (2013.01); *Y10T 428/24967* (2015.01)

(58) Field of Classification Search
USPC ............ 51/307, 309; 428/216, 336, 697, 698, 428/699; 204/192.1, 0.15, 0.16
See application file for complete search history.

(56) References Cited

U.S. PATENT DOCUMENTS

| | | | |
|---|---|---|---|
| 6,250,855 B1 * | 6/2001 | Persson .................. | C22C 29/08 51/309 |
| 6,326,093 B1 * | 12/2001 | Lindholm .............. | C22C 29/08 428/699 |

(Continued)

FOREIGN PATENT DOCUMENTS

| | | |
|---|---|---|
| CN | 101327524 A | 12/2008 |
| CN | 101596611 A | 12/2009 |

(Continued)

*Primary Examiner* — Archene Turner
(74) *Attorney, Agent, or Firm* — Corinne R. Gorski

(57) ABSTRACT

The present invention relates to a coated cutting tool comprising a substrate and a multilayered (Ti,Al)N coating. The coating comprises three zones: a first zone (A) closest to the substrate, a second zone (B) adjacent to the first zone and a third outermost zone (C). All three zones each comprises a multilayered aperiodic structure of (Ti,Al)N, where the average composition for each zone is different from each other and where the ratio between the thickness of the zone C and zone B is between 1.3 and 2.2 and where $z_{zone\ C} > z_{zone\ B}$, where z is the average composition for each zone of the ratio z=Ti/Al. The coating has a low residual stress.

11 Claims, 4 Drawing Sheets

(51) Int. Cl.
   *C23C 14/34*    (2006.01)
   *C23C 30/00*    (2006.01)
   *H01J 37/34*    (2006.01)
   *C23C 28/04*    (2006.01)
   *C23C 28/00*    (2006.01)

(56) References Cited

U.S. PATENT DOCUMENTS

| | | | |
|---|---|---|---|
| 6,627,049 | B2 * | 9/2003 | Jonsson .................. C22C 29/08 204/192.16 |
| 7,727,621 | B2 | 6/2010 | Nordlof |
| 8,455,116 | B2 | 6/2013 | Donnadieu |
| 8,889,252 | B2 * | 11/2014 | Yun ........................ C23C 28/044 428/697 |
| 2007/0141346 | A1 | 6/2007 | Nordlof |
| 2008/0299366 | A1 | 12/2008 | Ahlgren |
| 2009/0078565 | A1 | 3/2009 | Rodmar et al. |

FOREIGN PATENT DOCUMENTS

| | | |
|---|---|---|
| EP | 1222316 A1 | 7/2002 |
| WO | 2011099683 A1 | 8/2011 |

* cited by examiner ably between 1.4 and
COATED CUTTING TOOL

RELATED APPLICATION DATA

This application is a §371 National Stage Application of PCT International application No. PCT/EP2013/053807 filed Feb. 26, 3013 claiming priority of EP application No. 12157471.9, filed Feb. 29, 2012.

The present invention relates to a coated cutting tool comprising a substrate and a PVD coating, where the (Ti,Al)N coating has an aperiodic multilayered coating structure.

BACKGROUND (Ti,Al)N PVD coatings on cutting tools are well known in the art. Both homogenous coatings and coatings comprising a multiple of thin layers have been described in the art.

EP 983393 A1 describes an aperiodic multilayer structure of alternating nitride layers, e.g. TiN/TiAlN multilayers.

EP 1795628 A1 describes a coated cutting tool insert having a PVD coating comprising an aperiodic multilayered structure of alternating $Al_xTi_{1-x}N$ and $Ti_yAl_{1-y}N$ layers, where x=0.4-0.7 and y=0.6-1 with an average thickness of one A+B-sublayer within the range 30-300 nm, preferably 60-120 nm.

Multilayered (Ti,Al)N PVD coatings usually have compressive residual stresses which increase with coating thickness. If the compressive residual stresses become too high, the coating will crack, especially close to the cutting edge. On the other hand, a thicker coating will have a higher wear resistance which will prolong the tool life.

There is an ongoing strive to try to improve the performance of multilayered (Ti,Al)N PVD coatings and there is always an aim to achieve thicker coatings with low compressive stresses.

It is therefore an object of the present invention to provide a multilayered (Ti,Al)N PVD coating having a lower compressive residual stress.

It is another object of the present invention to provide a multilayered (Ti,Al)N PVD coating which can have an increased thickness without cracking.

It is yet another object of the present invention to provide a method of making a multilayered (Ti,Al)N PVD coating.

It has now been discovered that the above objectives can be achieved by the present invention as described below.

DRAWINGS

DETAILED DESCRIPTION OF THE PRESENT INVENTION

Figure 1:
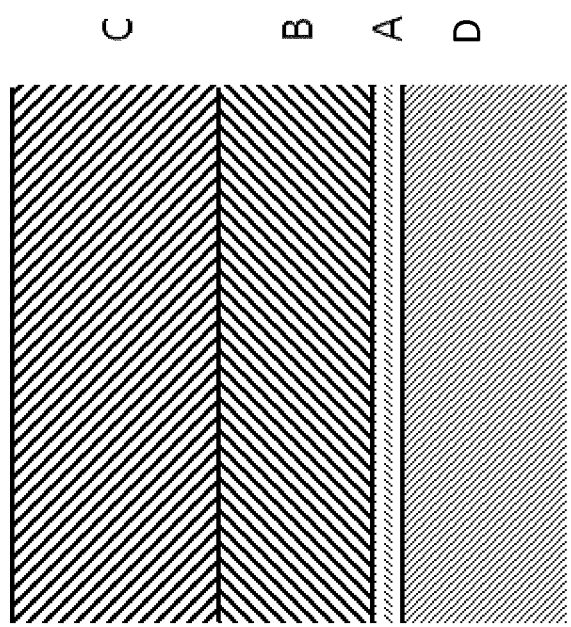
FIG. 1 is a schematic drawing of the coating according to the invention where A, B and C denotes the three different zones, A, B and C and where D denotes to substrate.
Figure 2:
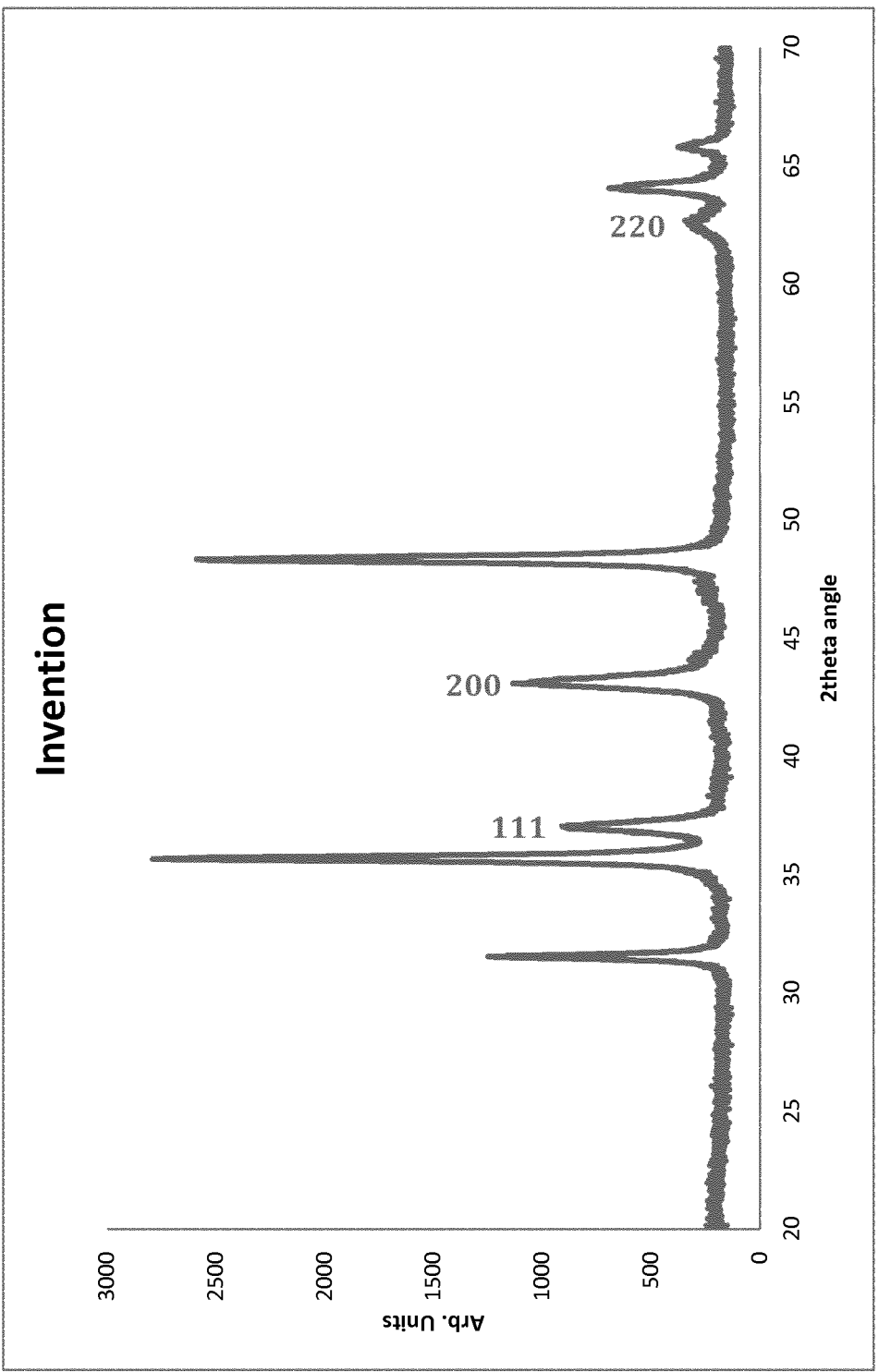
FIG. 2 is showing a XRD diffractogram of the coating according to the invention. Pronounced intensities of the I(111), I(200) and I(220) peaks can clearly be seen.
Figure 3:
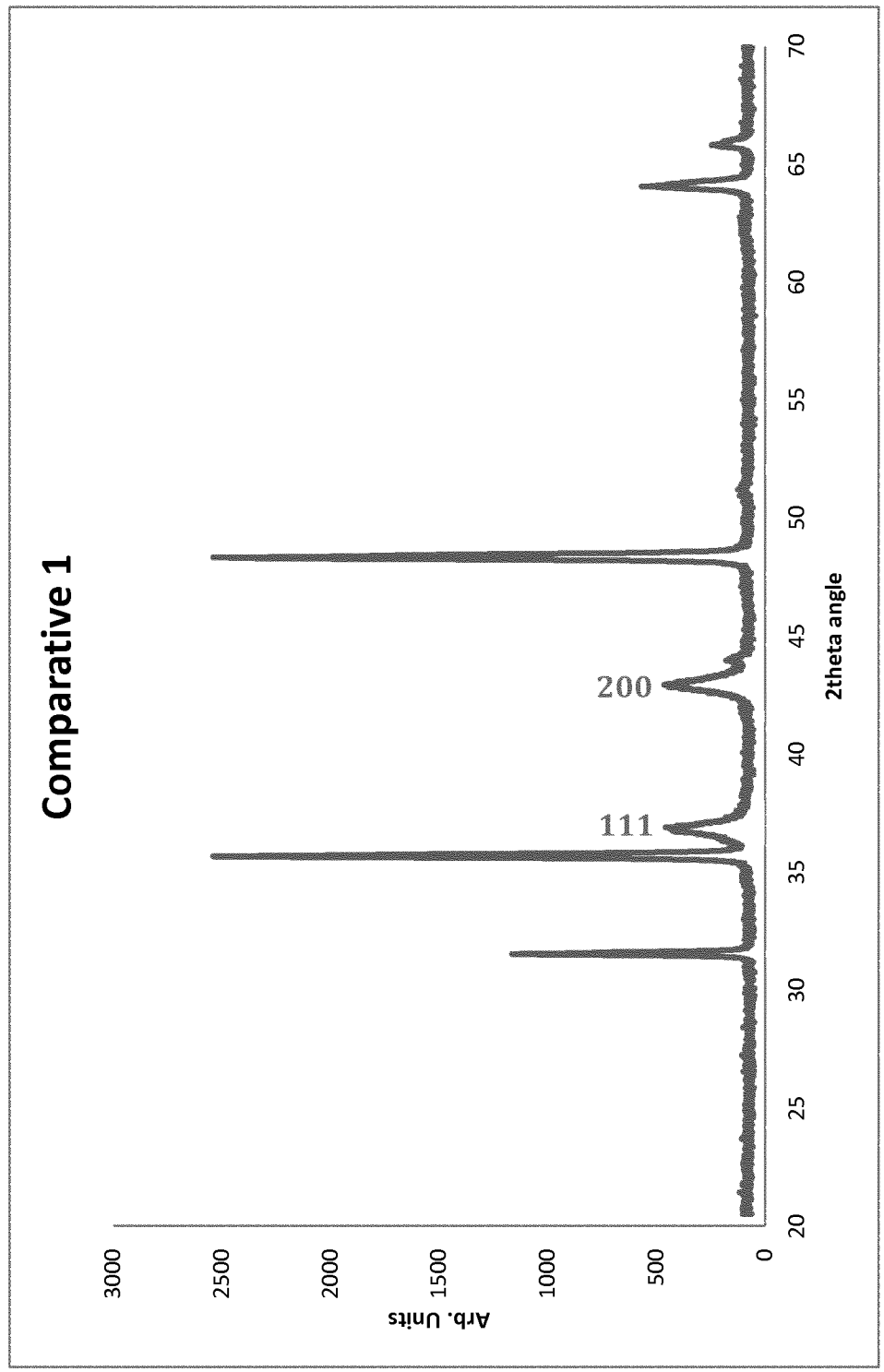
FIG. 3 is showing a XRD diffractogram of the coating according to Example 3 (comparative 1). The I(111) and I(200) peaks are less pronounced compared to FIG. 1 (invention).
Figure 4:
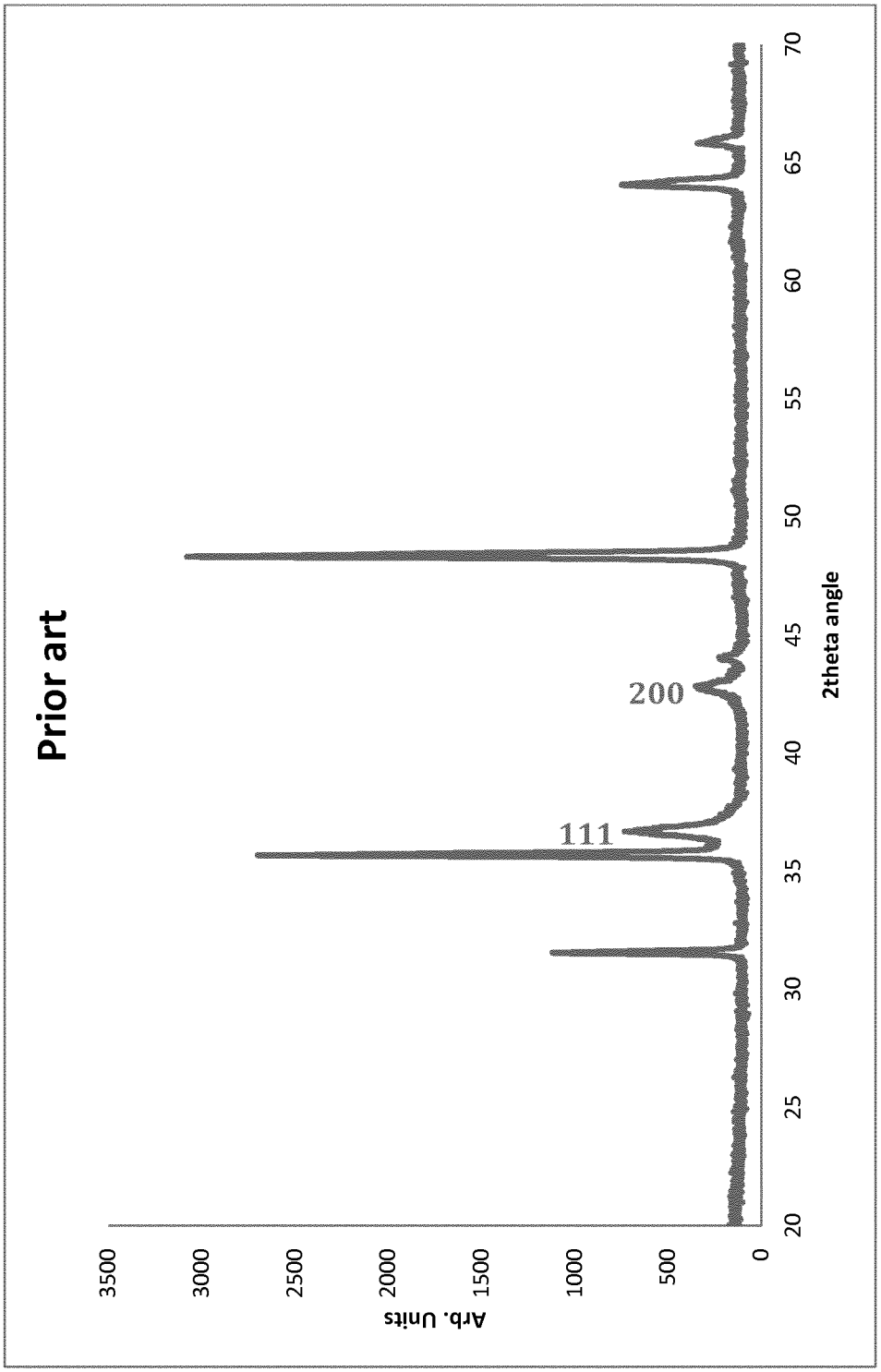
FIG. 4 is showing a XRD diffractogram of the coating according to Example 2 (prior art). The I(111) and I(200) peaks are less pronounced compared FIG. 1 (invention).

The present invention relates to a coated cutting tool comprising a substrate and a multilayered (Ti,Al)N coating. The coating comprises three zones: a first zone (A) closest to the substrate, a second zone (B) adjacent to the first zone and a third outermost zone (C). Zones B and C each comprises a multilayered aperiodic structure of alternating individual (Ti,Al)N layers X and Y where individual layer X has a composition with a higher Ti-content than individual layer Y. The average composition for each zone is different from each other and where the ratio between the thickness of the zone C and zone B is between 1.3 and 2.2 preferably between 1.4 and 1.9 and where $z_{zone\ C} > z_{zone\ B}$, where z is the average composition for each zone of the ratio z=Ti/Al.

Suitably, zone A is a homogenous (Ti,Al)N layer having a composition of $Ti_aAl_{1-a}N$, where 70≤a≤90, preferably 70≤a≤80. The thickness of zone A is suitably between 0.05 to 0.5 μm, preferably between 0.075 to 0.2 μm.

In one embodiment of the present invention, zones B and C each consists of a multilayered aperiodic structure of alternating individual (Ti,Al)N layers X and Y, i.e. no other layers are deposited in zones B and C.

Each zone comprises a multilayered aperiodic structure which within each zone is random, i.e. the thickness of a particular individual layer in the multilayered structure has no relation to the thickness of an individual layer immediately beneath, nor above the particular individual layer. The multilayered structure does not have any repeat period in the sequence of at least 10 consecutive individual layers. The average thickness of the individual layers is larger than 0.1 nm, but smaller than 100 nm, preferably larger than 0.5 nm, but smaller than 50 nm, most preferably larger than 1 nm, but smaller than 30 nm. The sum of any ten consecutive layers in the multilayered structure is smaller than 300 nm.

Within each of the zones B and C, the structure of the layer thickness also leads to that the composition of the multilayered aperiodic structure is varying in a random manner. Although, the composition will vary if measured in specific points, the average composition, as measured over a number of at least 100 individual layers, will be the same throughout the whole zone B and zone C respectively. This means that, within the whole zone, no distinct gradients, or other controlled patterns in composition will be present other than the random variation due to the aperiodic layer structure.

The composition of each individual layer in the multilayered structure cannot easily be measured without contribution from adjacent layers due to the low thickness. What can be measured is the average composition over a larger number if individual layers, preferably over the whole multilayer structure. However, the composition of each individual layer can be estimated from the composition of the targets used but that does not give an exact composition. When thicker layers have been deposited, thick enough to be analysed, it has been shown that the composition of the deposited layers can differ with a few percentage compared to the composition of the target material. Due to this fact, any composition of the individual layers of the multilayered structure according to the present invention mentioned herein after is estimations from the compositions of the targets used during the deposition.

By multilayered structure is herein meant a structure comprising at least 5 individual layers. However, it can comprise up to several thousand individual layers. The multilayered structure in zones B and C comprises alternating individual layers X and Y of (Ti,Al)N having different compositions from each other.

In one embodiment of the present invention, the individual layer X has a composition of $Ti_aAl_{1-a}N$, where 70≤a≤90, preferably 70≤a≤80 and the individual layer Y has a composition of $Ti_bAl_{1-b}N$, where 33≤b≤40, preferably 34≤b≤39.

The coating according to the present invention suitably has a residual compressive stress of between −0.5 to −1.5 GPa preferably between −0.75 to −1.25 GPa. The residual stress has been evaluated by X-ray diffraction measurements using the well known $\sin^2\psi$ method as described by I. C. Noyan, J. B. Cohen, Residual Stress Measurement by Diffraction and Interpretation, Springer-Verlag, New York, 1987 (pp 117-130). The measurements is performed using CuKα-radiation on the (Ti,Al)N (200) reflection. The side-inclination technique ($\psi$-geometry) has been used with six to eleven, preferably eight, $\psi$-angles, equidistant within a selected $\sin^2\psi$-range. An equidistant distribution of $\phi$-angles within a $\phi$-sector of 90° is preferred. To confirm a biaxial stress state, the sample shall be rotated for 0=0 and 90° while tilted in 4). It is recommended to investigate the possible presence of shear stresses and therefore both negative and positive $\psi$-angles shall be measured. In the case of an Euler ¼-cradle this is accomplished by measuring the sample also at $\phi$=180 and 270° for the different $\psi$-angles. The measurement shall be performed on an as flat surface as possible, preferably on a flank side of an insert. For the calculations of the residual stress values the Possion's ratio, =0.20 and the Young's modulus, E=450GPa are to be used. The data is evaluated using commercially available software such as DIFFRAC$^{Plus}$ Stress32 v. 1.04 from Bruker AXS preferably locating the (200) reflection by the Pseudo-Voigt-Fit function. In case of a biaxial stress state the total stress is calculated as the average of the obtained biaxial stresses.

The coating according to the present invention suitably has pronounced intensities of I(111), I(200) and I(220) when measured by XRD. The ratio of the intensities of the 111 and 200 peaks is suitably between 0.7 and 1.5, preferably between 0.8 and 1.4 and most preferably between 0.9 and 1.35. The ratio of the intensities of the 111 and 220 peaks is suitably between 1 and 7, preferably between 2 and 6.

The coating according to the present invention suitably has a hardness between 25 to 45 GPa, preferably between 30 and 40 GPa. The coating also has an elastic modulus between 450 and 650 GPa, preferably between 500 and 600 GPa. The hardness and elastic modulus has been evaluated using nanoindentation at 50 mN.

The total thickness of the whole coating is suitably from 0.5 to 15 μm, preferably from 1 to 10 μm, most preferably from 3 to 6 μm. All thicknesses given herein refer to measurements conducted on a reasonably flat surface being in direct line of sight from the targets. For inserts, being mounted on pins sticks during deposition, it means that the thickness has been measured on the middle of a side directly facing the target. For irregular surfaces, such as those on e.g. drills and end mills, the thicknesses given herein refers to the thickness measured on any reasonably flat surface or a surface having a relatively large curvature and some distance away from any edge or corner. For instance, on a drill, the measurements have been performed on the periphery and on an end mill the measurements has been performed on the flank side. The measurement herein has been done on polished cross sections.

The average chemical composition in the multilayered structure is measured using EDS (Energy Dispersive Spectroscopy) on the top view of the coating.

By cutting tool is herein meant an insert, drill, end-mill or an exchangeable drill tip.

In one embodiment of the present invention, the substrate is a cutting tool insert of cemented carbide, cermets, ceramics or cubic boron nitride.

In one embodiment of the present invention, the substrate is a drill or end mill of cemented carbide or high speed steel.

The present invention also relates to a method of making a coated cutting tool according to the above using cathodic arc evaporation. The deposition chamber comprises 6 flanges, each comprising at least one (Ti,Al)-target. 3 of the flanges comprise targets having composition X, and the other 3 flanges comprise targets having composition Y, where composition X has a higher Ti-content than composition Y. The method further comprises:

A first deposition step where the targets having composition X are active, in the presence of nitrogen gas and at a bias of between 100 to 200 V, preferably 125 to 175 V.

A second deposition step where the targets of all 6 flanges are active, in the presence of nitrogen gas and at a bias of between 30 to 60 V, preferably 35 to 50 V.

A third deposition step where one of the flanges comprising targets having composition Y is turned off leaving the remaining targets active, in the presence of $N_2$ gas and at a bias of between 30 to 60 V, preferably 35 to 50 V.

In one embodiment of the present invention, the deposition is continuous. By that is herein meant that the change between the different deposition steps is done without interruption, i.e. there are always at least 3 flanges that are active.

Each flange comprises at least one target, preferably 1-6 targets, more preferably 3-5 targets and most preferably 4 targets. Suitably, all targets within a flange all have the same composition. The targets are placed in the deposition chamber in such a way so that a flange comprising targets having composition X is always next to a flange comprising targets having composition Y.

In one embodiment of the present invention, the distance between the targets and tools to be coated is <200mm.

In one embodiment of the present invention, the target composition X has a composition of $Ti_aAl_{1-a}N$, where 70≤a≤90, preferably 70≤a≤80 and the target composition Y has a composition of $Ti_bAl_{1-b}N$, where 331:140, preferably 34≤b≤39.

The aperiodic sequence of the individual layer thicknesses is created by randomly rotating or moving the to-be-coated substrates, in front of said targets. This is preferably done by placing the substrates on a 3-fold rotating substrate table arranged in order to obtain the aperiodic structure. The 3-fold rotation can be adjusted with regard to rotating speed and rotating direction, clockwise or counter clockwise.

In one embodiment of the present invention, the deposition takes place in a deposition chamber as described in EP 2 037 000 A1.

A method of the invention may further comprise different pre-treatment or post-treatment steps.

In one embodiment of the invention the method comprises a pre-treatment comprising subjecting the substrate blasting, preferably a two-step blasting operation including a first dry blasting step to provide an edge rounding of the substrate followed by a second wet blasting step to remove residues from the dry blasting step. However, the blasting can be performed with either dry blasting or wet basting as well. The parameters for pre-treatment blasting can be varied and is well known to a person skilled in the art.

In one embodiment the coating formed by one or more of the above described steps is subjected to a post-treatment comprising blasting, alternatively shot-peening or the like. In one aspect the blasting may provide a smoother surface.

EXAMPLE 1

Invention

Cutting tools in the shape of exchangeable drill tips made of cemented carbide were placed in an PVD coating chamber, as described in EP 2 037 000 A1. The deposition was done by arc evaporation. The deposition chamber contained 6 flanges with 4 targets each. 3 of the flanges contained targets of an $Al_{0.25}Ti_{0.75}$ alloy and the 3 other flanges contained targets of an $Al_{0.67}Ti_{0.33}$ alloy.

A (Ti,Al)N adhesion layer (layer A) was deposited using the $Al_{0.25}Ti_{0.75}$ targets in a nitrogen atmosphere at a pressure of 8 μbar. The thickness of said adhesion layer was about 0.15 μm. A second layer (layer B) was deposited in a nitrogen atmosphere at a pressure of 20 μbar with all flanges active. An aperiodic lamella structure was obtained by 3 fold rotation of the tools inside of the deposition chamber. The thickness of the second layer was 1.9 μm. The average composition of this layer was $Al_{0.42}Ti_{0.58}$ determined by SEM-EDS. The third layer (layer C) was deposited in a nitrogen atmosphere at a pressure of 20 μbar using 5 of the 6 flanges, one flange with the target composition $Al_{0.67}Ti_{0.33}$ was turned off so that the amount of $Al_{0.67}Ti_{0.33}$ alloy targets active was ⅔ of amount of $Al_{0.25}Ti_{0.75}$ alloy targets active.

An aperiodic lamella structure was obtained by 3 fold rotation of the tools inside of the deposition chamber. The thickness of the third layer was 3 μm. The average target composition of the third layer was $Al_{0.38}Ti_{0.62}$ determined by SEM-EDS. A total thickness of the applied coating was 5 μm. Overall coating composition measured by SEM-EDS on top-view was $Al_{0.40}Ti_{0.60}$.

EXAMPLE 2

Prior Art

Cutting tools in the shape of exchangeable drill tips with the same size, geometry and composition as in Example 1 were placed in a PVD coating chamber from Oerlikon Balzers called RCS, the deposition was done by arc evaporation. A TiN adhesion layer was deposited using Ti targets in a nitrogen and argon atmosphere. The coating thickness of the TiN adhesion layer was 0.15 μm. A second layer was deposited in $N_2$ atmosphere at a pressure of 32 μbar using targets consisting of an $Al_{0.50}Ti_{0.50}$ and Ti alloy. An aperiodic lamella structure was obtained by 3 fold rotation of the tools inside of the deposition chamber. The thickness of the second layer was 3.2 μm. The average composition of the coating was $Al_{0.15}Ti_{0.85}$, determined by SEM-EDS. The third outer layer was deposited in a nitrogen and argon atmosphere using targets consisting of an $Al_{0.16}Ti_{0.84}$ alloy. An aperiodic lamella structure was obtained by 3 fold rotation of the tools inside of the deposition chamber. The thickness of the third layer was 0.3 μm. The average composition of the third layer was $Al_{0.16}Ti_{0.84}$ as determined by SEM-EDS. The total thickness of the applied coating was 3.7 μm.

EXAMPLE 3

Comparative 1

As a comparative example, a coating comprising layers A, B and C was deposited using same principle as in Example 1 but with the difference that the ratio between the thickness of layers B and C were 1, i.e. the both layers had the same thickness. The total thickness of the coating was 3.2 μm. This coating is called Comparative 1.

EXAMPLE 4

Comparative 2

As another comparative example, a coating comprising only layers A and B was deposited. The coating was deposited using same principle as in Example 1. This coating is called Comparative 2.

EXAMPLE 5

Residual Stresses

The residual stress was measured on the coatings as deposited in Examples 1-5. The measurements were done by XRD using as described in the description. The results can be seen in Table 1.

TABLE 1

| Sample | Residual stress (GPa) |
|---|---|
| Invention (Example 1) | −0.92 |
| Prior art (Example 2) | −3.5 |
| Comparative 1 (C/B ratio = 1) | −2.6 |
| Comparative 2 (A + B) | −3.7 |

EXAMPLE 6

Tools from Example 1 and 2 were tested in drilling.
Operation Drilling
Work piece material SS2541
Cutting speed 80 m/min
Feed 0.3 mm/r
With coolant
Tool life criterion was chipping along cutting edge and wear on corner. The tool life was measured in the number of holes that were drilled until the tool life criterion was met. The results can be seen in Table 2.

TABLE 2

| | Number of holes |
|---|---|
| Invention (Example 1) | 2000 |
| Prior art (Example 2) | 1268 |

EXAMPLE 7

Tools from Example 1, 2 and 3 (comparative 1) were tested in drilling.
Operation Drilling
Work piece material SS2541
Cutting speed 100 m/min
Feed 0.4 mm/r
With coolant
Tool life criterion was chipping along cutting edge and wear on corner. The tool life was measured in the number of holes that were drilled until the tool life criterion was met. The results can be seen in Table 3.

TABLE 3

| | Number of holes |
|---|---|
| Invention (Example 1) | 2000 |
| Prior art (Example 2) | 1024 |
| Comparative 1 | 854 |

The invention claimed is:

1. A coated cutting tool comprising:
   a substrate; and
   a multilayered (Ti,Al)N coating, wherein the coating includes three zones: a first zone (A) closest to the substrate, a second zone (B) adjacent to the first zone and a third outermost zone (C) the second and third zones B and C each having a multilayered aperiodic structure of alternating individual (Ti,Al)N layers X and Y, wherein an individual layer X has a composition with a higher Ti-content than an individual layer Y, the individual layer X having a composition of $Ti_aAl_{1-a}N$, where $70<a<90$, and the individual layer Y having a composition of $Ti_bAl_{1-b}N$, where $33<b<40$, the average composition for each zone being different from each other and a ratio between the thickness of zone C and zone B is between 1.3 and 2.2 and where $z_{zone\ C} > z_{zone\ B}$, where z is the average composition for each zone of the ratio z=Ti/Al.

2. A coated cutting tool according to claim 1, wherein the individual layer X has a composition of $Ti_aAl_{1-a}N$, where $70 \leq a \leq 80$ and the individual layer Y has a composition of $Ti_bAl_{1-b}N$, where $34 \leq b \leq 39$.

3. A coated cutting tool according to claim 1, wherein the thickness of the sum of ten consecutive individual layers in the aperiodic structure is smaller than 300 nm.

4. A coated cutting tool according to claim 1, wherein a compressive residual stress is between −0.5 to −1.5 GPa.

5. A coated cutting tool according to claim 1, wherein the ratio between the thickness of the zone C and zone B is between 1.4 and 1.9.

6. A coated cutting tool according to claim 1, wherein the first zone is a homogenous (Ti,Al)N layer having a composition of $Ti_aAl_{1-a}N$, where $70 \leq a \leq 90$.

7. A coated cutting tool according to claim 1, wherein zones B and C each comprise a multilayered aperiodic structure of alternating (Ti,Al)N layers X and Y.

8. A method of making a coated cutting tool comprising the steps of:
   providing substrates to be coated;
   placing the substrates in a deposition chamber having a total of 6 flanges each flange including at least one (Ti,Al)-target, wherein 3 of the flanges include targets having a composition X and the other 3 flanges include targets having a composition Y, where composition X has a higher Ti-content than composition Y;
   depositing the substrates in a first deposition step, wherein the targets having composition X are active in the presence of nitrogen gas and at a bias of between 100 to 200 V;
   depositing the substrates in a second deposition step, wherein the targets of all 6 flanges are active in the presence of nitrogen gas and at a bias of between 30 to 60 V; and
   depositing the substrates in a third deposition step, wherein one of the flanges having targets having composition Y is turned off leaving the remaining targets active in the presence of nitrogen gas and at a bias of between 30 to 60 V.

9. A method of making a coated cutting tool according to claim 8, wherein the target X has a composition of $Ti_aAl_{1-a}N$, where $70 \leq a \leq 90$, and the target Y has a composition of $Ti_bAl_{1-b}N$, where $33 \leq b \leq 40$.

10. A method of making a coated cutting tool according to claim 8, wherein the target X has a composition of $Ti_aAl_{1-a}N$, where $70 \leq a \leq 80$, and the target Y has a composition of $Ti_bAl_{1-b}N$, where $34 < b < 39$.

11. A method of making a coated cutting tool according to claim 8, wherein the deposition is continuous.

* * * * *